United States Patent
Bornfreund et al.

(10) Patent No.: US 8,552,480 B2
(45) Date of Patent: *Oct. 8, 2013

(54) ALUMINUM INDIUM ANTIMONIDE FOCAL PLANE ARRAY

(75) Inventors: Richard E. Bornfreund, Santa Barbara, CA (US); Jeffrey B. Barton, Santa Barbara, CA (US)

(73) Assignee: Flir Systems, Inc., Wilsonville, OR (US)

( * ) Notice: Subject to any disclaimer, the term of this patent is extended or adjusted under 35 U.S.C. 154(b) by 355 days.

This patent is subject to a terminal disclaimer.

(21) Appl. No.: 12/847,833

(22) Filed: Jul. 30, 2010

(65) Prior Publication Data

US 2011/0221025 A1    Sep. 15, 2011

Related U.S. Application Data

(63) Continuation-in-part of application No. 12/723,374, filed on Mar. 12, 2010.

(51) Int. Cl.
  *H01L 31/062* (2012.01)
(52) U.S. Cl.
  USPC ..... 257/290; 257/291; 257/292; 257/E31.084
(58) Field of Classification Search
  USPC ............ 257/290–292, E31.084; 250/370.13, 250/370.06
  See application file for complete search history.

(56) References Cited

U.S. PATENT DOCUMENTS

| 5,449,943 A | 9/1995 | Kasai et al. |
| 5,646,437 A | 7/1997 | Kasai et al. |
| 7,494,911 B2 | 2/2009 | Hudait et al. |
| 7,583,715 B2 | 9/2009 | Hill et al. |
| 2007/0090337 A1 | 4/2007 | Ueno et al. |
| 2007/0160100 A1 | 7/2007 | Huffaker et al. |
| 2007/0215900 A1 | 9/2007 | Maimon |
| 2008/0090319 A1 | 4/2008 | Ginn et al. |
| 2008/0111152 A1 | 5/2008 | Scott et al. |

OTHER PUBLICATIONS

U.S. Appl. No. 12/723,374.*
Maimon et al., nBn detector, an infrared detector with reduced dark current and higher operating temperature, Applied Physics Letters 89, 151109 (2006), 3 pages.
Haigh, et al., "Mid-Infrared $Al_xIn_{1-x}Sb$ Light-Emitting Diodes", Applied Physics Letters, AIP, American Institute of Physics, Melville, NY, US, vol. 90, No. 23, Jun. 11, 2007, pp. 231116-1-231116-3.
Kuze, et al., "High Performance Miniaturized InSb Photovoltaic Infrared Sensors Operating at Room Temperature", ScienceDirect, Journal of Crystal Growth, vol. 301-302, Mar. 24, 2007, pp. 997-1000.
Sim, et al., "Medium Wavelength Infrared Detector with Diffused $Al_xIn_{1-x}Sb/InSb$ Quantum-Well Structure", Electron Devices Meeting, 1998 Proceedings, IEEE, Aug. 29, 1998, pp. 18-21.

\* cited by examiner

*Primary Examiner* — Samuel Gebremariam
(74) *Attorney, Agent, or Firm* — Haynes and Boone, LLP

(57) ABSTRACT

In one embodiment, a detector includes an $Al_zIn_{(1-x)}Sb$ passivation/etch stop layer, an $Al_xIn_{(1-x)}Sb$ absorber layer disposed above the $Al_zIn_{(1-z)}Sb$ passivation/etch stop layer, and an $Al_yIn_{(1-y)}Sb$ passivation layer disposed above the $Al_xIn_{(1-x)}Sb$ absorber layer, wherein x<z and x<y. The detector further includes a junction formed in a region of the $Al_xIn_{(1-x)}Sb$ absorber layer, and a metal contact disposed above the junction and through the $Al_yIn_{(1-y)}Sb$ passivation layer.

20 Claims, 13 Drawing Sheets

ALUMINUM INDIUM ANTIMONIDE FOCAL PLANE ARRAY

CROSS-REFERENCE TO RELATED APPLICATIONS

This application is a continuation-in-part of U.S. application Ser. No. 12/723,374, filed Mar. 12, 2010, the disclosure of which is incorporated herein by reference in its entirety for all purposes.

TECHNICAL FIELD

One or more embodiments of the invention relate generally to infrared cameras and, more particularly, to indium antimonide (InSb) detectors and focal plane arrays.

BACKGROUND

InSb-based detectors (e.g., photodiode) are used in many infrared (IR) sensor applications. For example, InSb-based detectors have found particular use in infrared detection and imaging applications in the 3-5 micron IR wavelength band, and can be useful due to their ability to operate in conditions where imaging operations in the visible spectrum are negatively impacted by reduced visibility. As a specific example, IR imaging devices can provide useful real-time images at night or when imaging operations in the visible spectrum have been degraded due to smoke or sand.

These detectors, however, face limitations in terms of electro-optical performance and insufficient operating temperatures. Limitations in detector performance are often the by-product of manufacturing processes. In particular, conventional manufacturing processes utilize non-optimal material systems, create defects at interfaces, and leave unpassivated surface states, which can contribute to producing undesirable dark current and reduce electro-optical and temperature performance.

As a result, there is a need for improved detectors and manufacturing processes that enhance detector performance.

SUMMARY

In accordance with one embodiment, a detector includes a $Al_zIn_{(1-z)}Sb$ passivation/etch stop layer, an $Al_xIn_{(1-x)}Sb$ absorber layer disposed above the $Al_zIn_{(1-z)}Sb$ passivation/etch stop layer, wherein x<z, and an $Al_yIn_{(1-y)}Sb$ passivation layer disposed above the $Al_xIn_{(1-x)}Sb$ absorber layer, wherein x<y. The detector further includes a junction formed in a region of the $Al_xIn_{(1-x)}Sb$ absorber layer, and a metal contact disposed above the junction and through the $Al_yIn_{(1-y)}Sb$ passivation layer.

In accordance with another embodiment, an infrared sensor array includes a two-dimensional array of detectors. Each of the detectors includes a $Al_zIn_{(1-z)}Sb$ passivation/etch stop layer, an $Al_xIn_{(1-x)}Sb$ absorber layer disposed above the $Al_zIn_{(1-z)}Sb$ passivation/etch stop layer, wherein x<z, and an $Al_yIn_{(1-y)}Sb$ passivation layer disposed above the $Al_xIn_{(1-x)}Sb$ absorber layer, wherein x<y. Each detector further includes a junction formed in a region of the $Al_xIn_{(1-x)}Sb$ absorber layer, and a metal contact disposed above the junction and through the $Al_yIn_{(1-y)}Sb$ passivation layer. An overglass layer is disposed above the metal contact, and a bump contact is disposed above the metal contact and through the overglass layer.

In accordance with another embodiment, a method of fabricating a detector includes providing an InSb substrate, and forming, by epitaxial growth in one growth run, a $Al_zIn_{(1-z)}Sb$ passivation/etch stop layer, an $Al_xIn_{(1-x)}Sb$ absorber layer disposed above the $Al_zIn_{(1-z)}Sb$ passivation/etch stop layer, and an $Al_yIn_{(1-y)}Sb$ passivation layer disposed above the $Al_xIn_{(1-x)}Sb$ absorber layer, wherein x<z and x<y. The method further includes forming a junction in a region of the $Al_xIn_{(1-x)}Sb$ absorber layer, forming a metal contact above the junction and through the $Al_yIn_{(1-y)}Sb$ passivation layer, and removing the InSb substrate to expose the $Al_zIn_{(1-z)}Sb$ passivation/etch stop layer.

The scope of the invention is defined by the claims, which are incorporated into this summary by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Systems and methods are disclosed herein to provide a detector (e.g., photodiode) and/or an infrared sensor array with improved electro-optical performance and increased operating temperatures in accordance with one or more embodiments.

Figure 1:
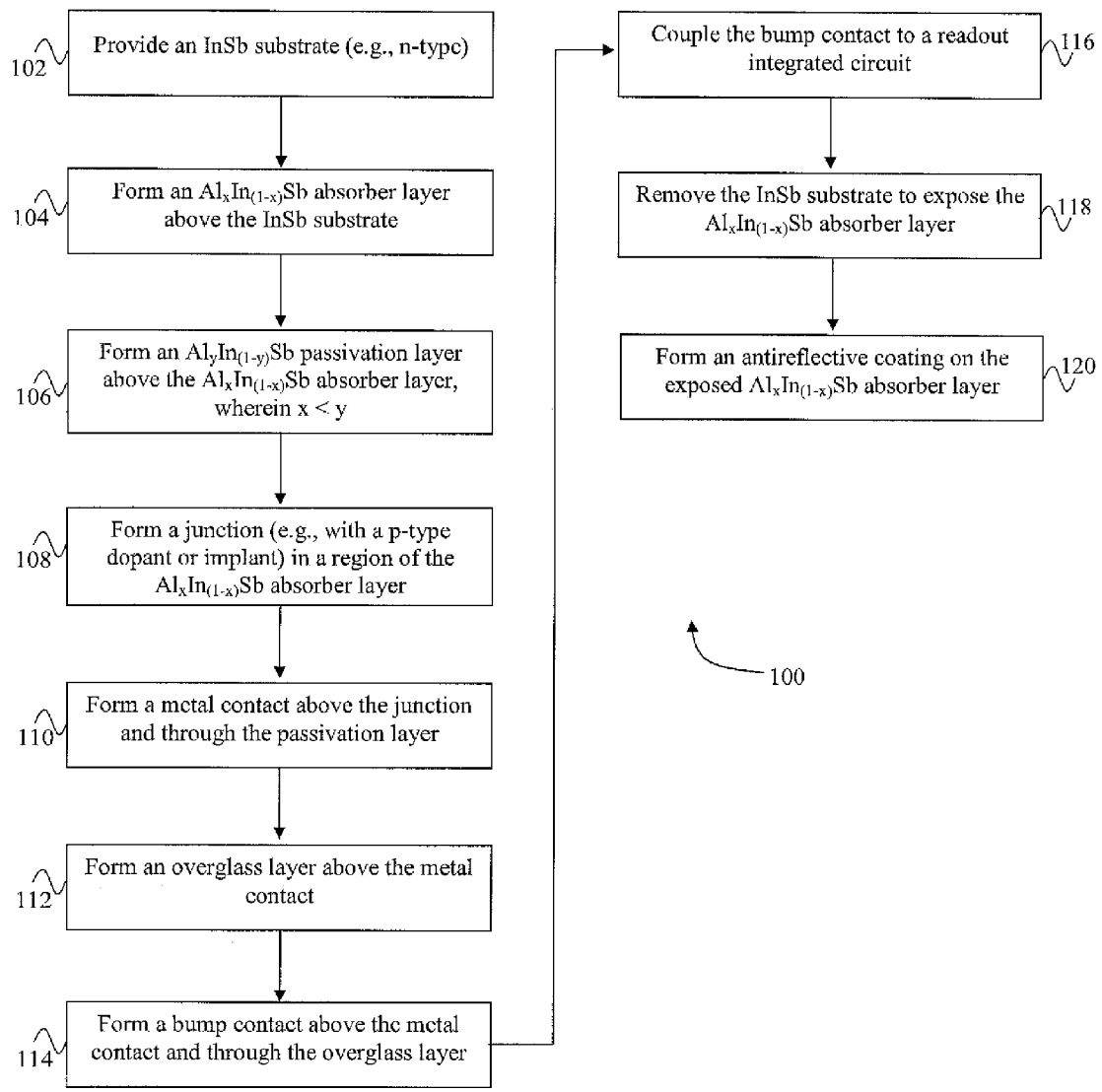
FIG. 1 shows a flow diagram illustrating a method of fabricating a detector in accordance with an embodiment.

For example, in accordance with an embodiment, FIG. 1 shows a flow diagram illustrating a method 100 of fabricating an improved detector of a detector array. At block 102, an InSb substrate is provided. Other substrates may be used in other embodiments, such as an AlInSb substrate. At block 104, an $Al_xIn_{(1-x)}Sb$ absorber layer is formed above the InSb substrate. At block 106, an $Al_yIn_{(1-y)}Sb$ passivation layer is formed above the $Al_xIn_{(1-x)}Sb$ absorber layer, with x being less than y, thereby providing a passivation layer with a wider bandgap than the absorber layer.

At block 108, a junction is formed in a region of the $Al_xIn_{(1-x)}Sb$ absorber layer through the $Al_yIn_{(1-y)}Sb$ passivation layer. In one example, a p-type dopant or implant may be used in an n-type doped absorber layer to form a p-n junction. In other examples and embodiments, an n-type dopant or implant may be used in a p-type doped absorber layer to form an n-p junction. At block 110, a metal contact is formed above the junction and through the passivation layer.

At block 112, an overglass layer is formed above the metal contact, and at block 114, a bump contact (e.g., comprised of indium) is formed above the metal contact and through the overglass layer. In other examples and embodiments, the fabrication order of blocks 110 and 112 may be switched such that 1) an overglass layer is formed above the passivation layer and junction, 2) then a metal contact is formed directly above the junction through the overglass and passivation layers, and 3) a bump contact is formed above the metal contact (without going through an overglass layer).

Next, at block 116, the bump contact is coupled to a readout integrated circuit (ROIC). Finally, backside processing takes place in which the InSb substrate is removed to expose the absorber layer at block 118, and an antireflective coating is formed on the exposed absorber layer at block 120. Therefore, for an embodiment, an array of detectors may be provided to form at least in part a sensor array.

Figure 2A:
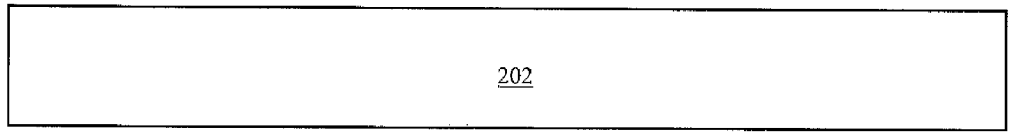
FIGS. 2A-2K show cross-sectional diagrams illustrating fabrication processes of a detector in accordance with an embodiment of the method shown in FIG. 1.

Referring now to FIGS. 2A-2K, cross-sectional diagrams illustrate fabrication processes of a detector in accordance with an embodiment. FIG. 2A illustrates an InSb substrate 202. The InSb substrate 202 may be, in one example, doped with an n-type dopant. Surfaces of substrate 202 are cleaned to provide surfaces substantially free of unwanted contaminants. Examples of cleaning techniques include but are not limited to oxygen removal by thermal desorption or hydrogen cleaning.

Figure 2B:
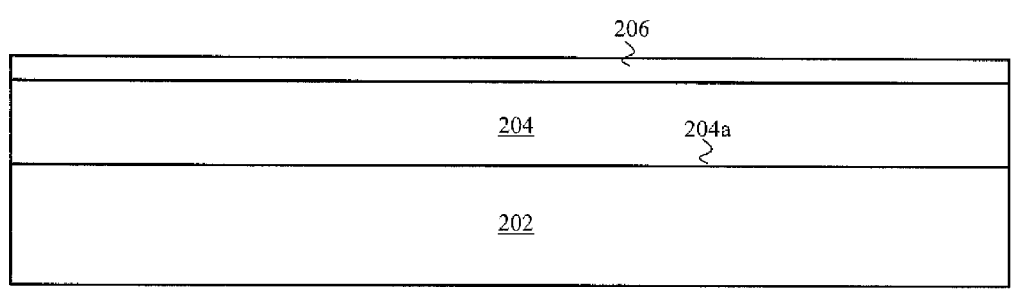

FIG. 2B illustrates an $Al_xIn_{(1-x)}Sb$ absorber layer 204 formed above a first surface of the InSb substrate 202 (a near-lattice matched substrate), and an $Al_yIn_{(1-y)}Sb$ passivation layer 206 formed above the $Al_xIn_{(1-x)}Sb$ absorber layer 204, with x being less than y, thereby providing the passivation layer 206 with a wider bandgap than the absorber layer 204. In one example, x is between about 0.01 and about 0.1, and y is between about 0.02 and about 0.13. In another example, x is between about 0.01 and about 0.03, and y is between about 0.03 and about 0.05. In one example, the $Al_xIn_{(1-x)}Sb$ absorber layer 204 has a thickness between about 30,000 angstroms and about 150,000 angstroms, and the $Al_yIn_{(1-y)}Sb$ passivation layer 206 has a thickness between about 100 angstroms and about 10,000 angstroms.

In yet another example, the $Al_xIn_{(1-x)}Sb$ absorber layer 204 has a thickness of about 150,000 angstroms, and the $Al_yIn_{(1-y)}Sb$ passivation layer 206 has a thickness of about 2,000 angstroms. In yet another example, the $Al_xIn_{(1-x)}Sb$ absorber layer may be doped with an n-type dopant at a doping concentration of about $10^{15}$ cm$^{-3}$, and the $Al_yIn_{(1-y)}Sb$ passivation layer may be doped with an n-type dopant at a doping concentration of about $10^{18}$ cm$^{-3}$.

The $Al_xIn_{(1-x)}Sb$ absorber layer 204 and the $Al_yIn_{(1-y)}Sb$ passivation layer 206 are each epitaxial layers formed consecutively during one growth run in accordance with an embodiment. The absorber and passivation layers may be formed by various techniques for forming epitaxial layers, such as but not limited to, molecular beam epitaxy (MBE), metal-organic condensed vapor deposition (MOCVD), or liquid phase epitaxy. Advantageously, by forming the absorber layer and the passivation layer consecutively during one growth run, defects at the interface of the absorber layer and the passivation layer are substantially eliminated, thereby improving electro-optical and temperature performance of the detector to be fabricated.

Furthermore, by forming the $Al_xIn_{(1-x)}Sb$ absorber layer 204 and the $Al_yIn_{(1-y)}Sb$ passivation layer 206 consecutively during a single growth run, the incorporation of contaminants and/or growth defects at the absorber/passivation interface, which can decrease device performance, is minimized or substantially avoided and ultimately removes the substrate-passivation interface from the critical layer interfaces.

Also, the AlInSb materials used in the absorber layer of one embodiment allow for shortening the material cutoff when compared to InSb, which has a longer electro-optical cutoff than necessary to fully absorb the desired wavebands, thus allowing for lower dark current and improved electro-optical performance at elevated operating temperatures.

Although in this embodiment, the $Al_xIn_{(1-x)}Sb$ absorber layer is formed above a near-lattice matched InSb substrate, forming an absorber layer above a non-lattice matched substrate using appropriate buffer layers therebetween is within the scope of other embodiments. It is noted that absorber layer 204 includes a backside surface 204a which is later exposed when substrate 202 is removed, as will be explained in further detail below in conjunction with FIGS. 2J and 2K.

Figure 2C:
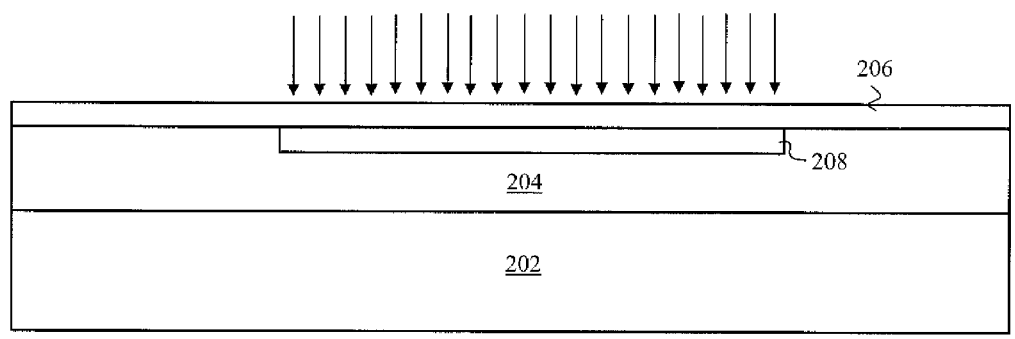

FIG. 2C illustrates a doped region 208 formed in the $Al_xIn_{(1-x)}Sb$ absorber layer 204 through the $Al_yIn_{(1-y)}Sb$ passivation layer 206 to form a junction in a region of the absorber layer, thereby forming a detector region in the absorber layer. In one example, a p-type dopant or implant may be used in an n-type doped absorber layer to form a p-n junction. Formation of the detector array includes, in one example, providing a photoresist (not shown) with a junction formation pattern over the wafer of FIG. 2B, and then exposing and developing the pattern in accordance with conventional photolithographic techniques.

The wafer is then ion implanted through the photoresist pattern to form an array of individual junctions or pixels in the absorber layer 204. The wafer is then annealed to activate the implants and to substantially remove implant damage (i.e., fix semiconductor material potentially damaged during the implant process). It is noted that either p-type implantation or thermal diffusion of a p-type doping material may be used to form the doped regions. Examples of p-type implant materials include but are not limited to Be, Se, and S, and examples of p-type doping materials include but are not limited to Cd, Hg, and Zn. In other examples and embodiments, an n-type dopant or implant may be used in a p-type doped absorber layer to form a n-p junction.

Figure 5A:
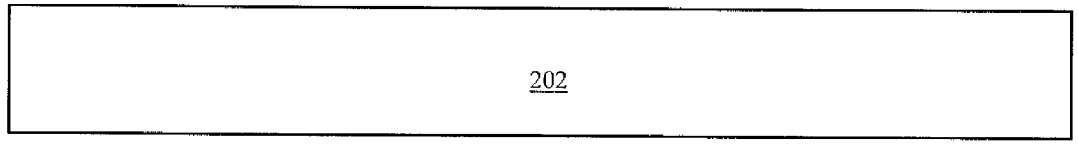
FIGS. 5A-5C show cross-sectional diagrams illustrating fabrication processes of a detector in accordance with another embodiment.
Figure 5B:
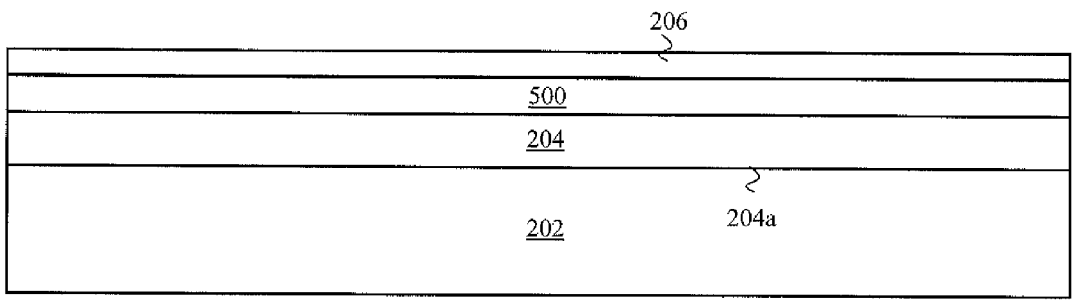
Figure 5C:
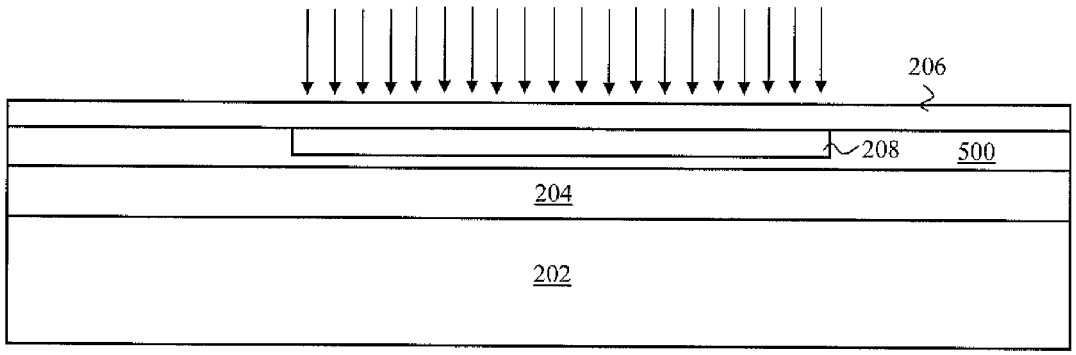

Although not explicitly shown in this embodiment, growth of an intrinsic layer (e.g., lightly doped or undoped) between the absorber layer 204 and the passivation layer 206 to subsequently form p-i-n or n-i-p junctions is within the scope of other embodiments as illustrated in FIGS. 5A-5C.

Referring to FIG. 5A, an InSb substrate 202 is illustrated as described above with respect to FIG. 2A. Other substrates may be used in other embodiments.

FIG. 5B illustrates an $Al_xIn_{(1-x)}Sb$ absorber layer 204 formed above a first surface of the InSb substrate 202 (a near-lattice matched substrate), an intrinsic layer 500 (of composition x) formed above the absorber layer 204, and an $Al_yIn_{(1-y)}Sb$ passivation layer 206 formed above the intrinsic layer 500, with x being less than y (x<y), thereby providing the passivation layer 206 with a wider bandgap than the absorber layer 204. In one example, the intrinsic layer 500 has a thickness between about 15,000 angstroms and about 100,000 angstroms, and may be doped either unintentionally or with a dopant at a doping concentration of about 1e14 cm$^{-3}$ to about 5e14 cm$^{-3}$. The $Al_xIn_{(1-x)}Sb$ absorber layer 204, the intrinsic layer 500, and the $Al_yIn_{(1-y)}Sb$ passivation layer 206 are each epitaxial layers formed consecutively during one growth run in accordance with an embodiment. The absorber, intrinsic, and passivation layers may be formed by various techniques for forming epitaxial layers, such as but not limited to, molecular beam epitaxy (MBE), metal-organic condensed vapor deposition (MOCVD), or liquid phase epitaxy (LPE).

Alternatively, the absorber layer 204 may be thin (~3000 Å) and of composition z ($Al_zIn_{(1-z)}Sb$), the intrinsic layer of composition x ($Al_xIn_{(1-x)}Sb$), and the passivation layer of composition y ($Al_yIn_{(1-y)}Sb$), with z greater than x (z>x), y greater than x (y>x), and the intrinsic layer being the primary absorbing layer and being backside passivated as well.

FIG. 5C illustrates a doped region 208 formed in the intrinsic layer 500 through the $Al_yIn_{(1-y)}Sb$ passivation layer 206 to form a junction in a region of the intrinsic layer, thereby forming a detector region in the intrinsic layer. In one example, a p-type dopant or implant may be used in n-type doped absorber and intrinsic layers to form a p-i-n junction. It is noted that either p-type implantation or thermal diffusion of a p-type doping material may be used to form the doped regions. Examples of p-type implant materials include but are not limited to Be, Se, and S, and examples of p-type doping materials include but are not limited to Cd, Hg, and Zn. In other examples and embodiments, an n-type dopant or implant may be used in p-type doped absorber and intrinsic layers to form a n-i-p junction.

Figure 2D:
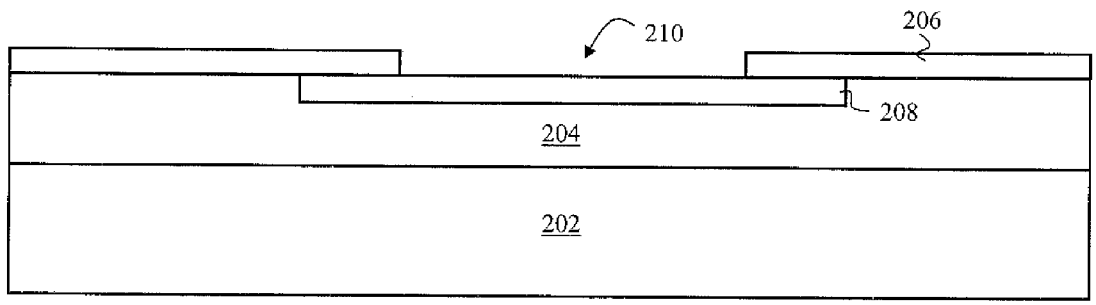

Referring now back to FIG. 2D, an etch of the passivation layer 206 is illustrated to form an opening 210 in passivation layer 206 above the doped region 208 and the junction. A photoresist pattern (not shown) may be used in accordance with conventional photolithography and etching techniques to perform the etch of the passivation layer over each doped region 208 and junction.

Figure 2E:
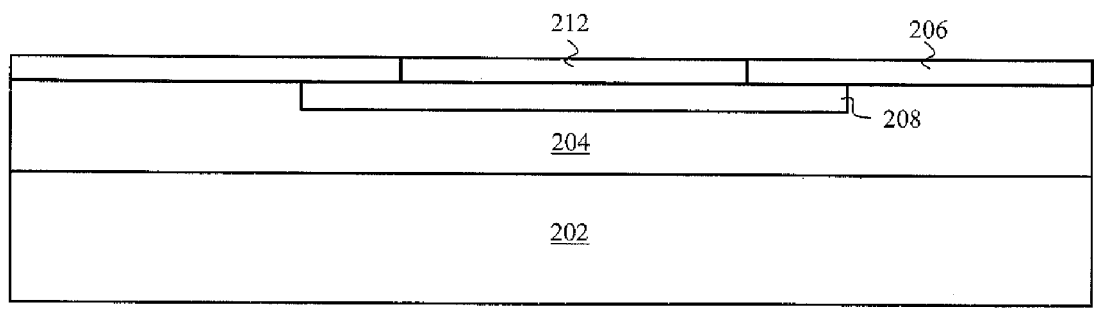

FIG. 2E illustrates a metal contact 212 formed above the junction 208 and through the passivation layer 206 within opening 210. Metal contact 212 may be comprised of various metals, including but not limited to nickel, chrome, titanium, tungsten, indium, or alloys thereof, and may be deposited by various techniques, including but not limited to evaporation or sputtering. A liftoff process then removes excess metal. In another example, sheet deposition of metal film, photolithography, and etch may be used to form the metal contact, such as in plating applications.

Figure 2F:
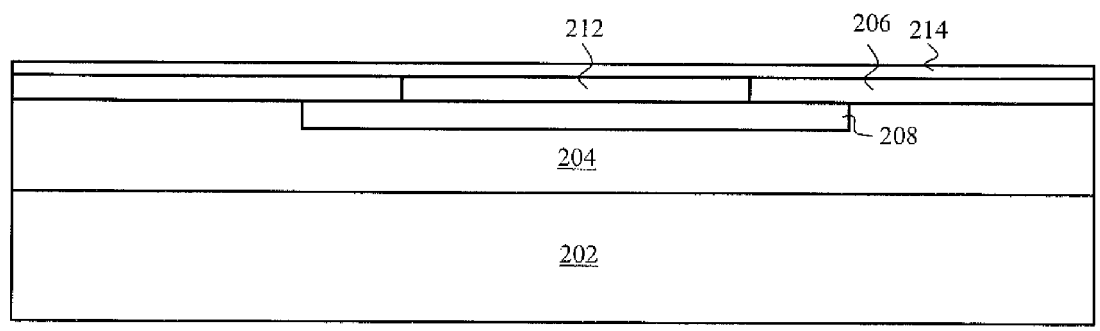

FIG. 2F illustrates an overglass layer 214 formed above the metal contact 212 and passivation layer 206. Overglass layer 214 may be comprised of various materials, including but not limited to silicon nitride, silicon oxide, silicon oxynitride, or combinations thereof, and may be deposited by various techniques, including but not limited to chemical vapor deposition (CVD) or plasma-enhanced CVD.

Figure 2G:
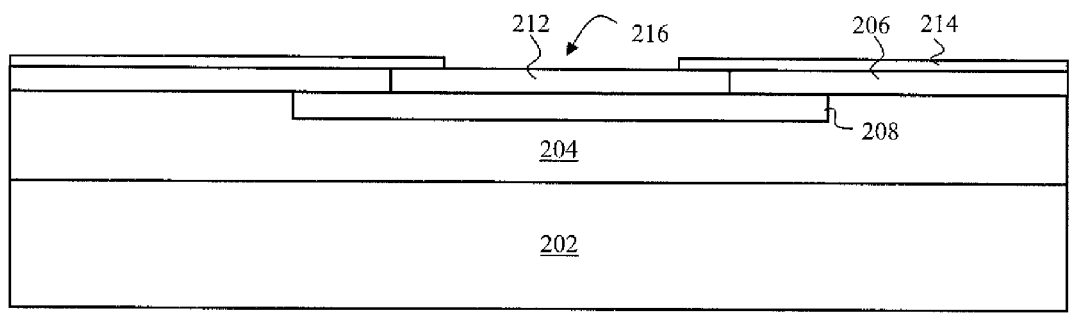

FIG. 2G illustrates an etch of the overglass layer 214 through a photoresist pattern to form an opening 216 in overglass layer 214 above the metal contact 212. A photoresist pattern (not shown) may be used in accordance with conventional photolithography and etch techniques to perform the etch of the overglass layer over each doped region 208 and junction.

Figure 2H:
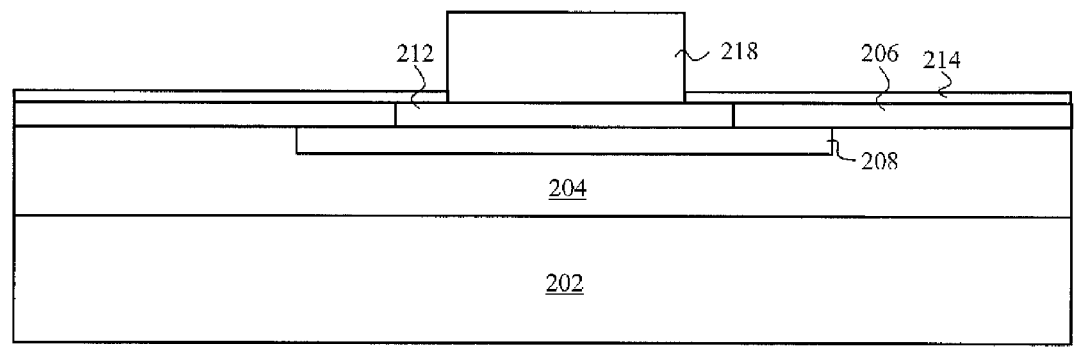

FIG. 2H illustrates a bump contact 218 formed above the metal contact 212 and through the overglass layer 214 within opening 216. Bump contact 218 may be comprised of various materials, including but not limited to indium, and may be deposited by various techniques, including but not limited to evaporation or plating. A liftoff process then removes excess indium.

In other examples and embodiments, the fabrication order may be switched such that 1) an overglass layer is formed above the passivation layer and junction, 2) then a metal contact is formed directly above the junction through the overglass and passivation layers, and 3) a bump contact is formed above the metal contact (without going through an overglass layer).

Figure 2I:
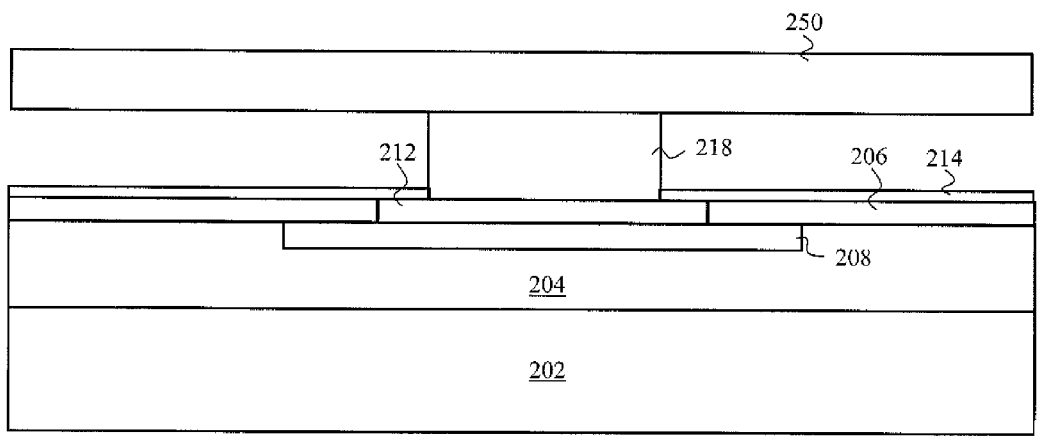

Next, in FIG. 2I, the bump contact 218 is operably coupled to a readout integrated circuit (ROIL) 250 to form a focal plane array structure. Fabrication of the detector array includes, in one example, aligning an array of indium bumps on the detector array to corresponding indium bumps (not shown) on the ROIC 250 and operably coupling the corresponding indium bumps together.

Figure 2J:
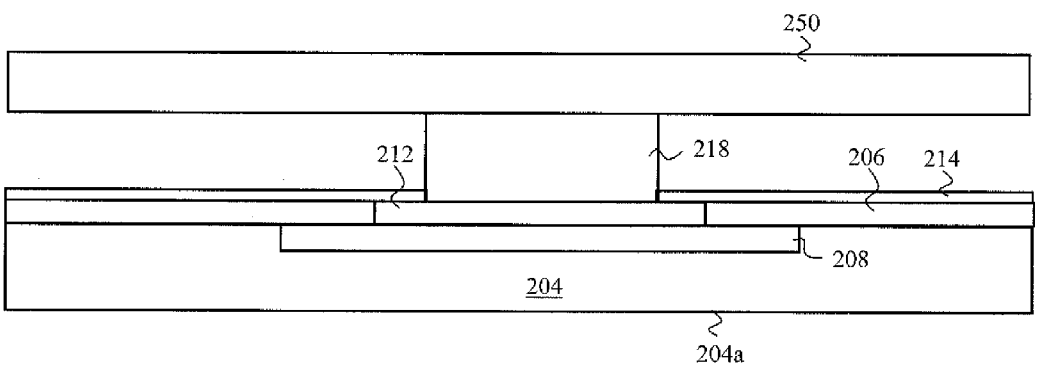
Figure 2K:
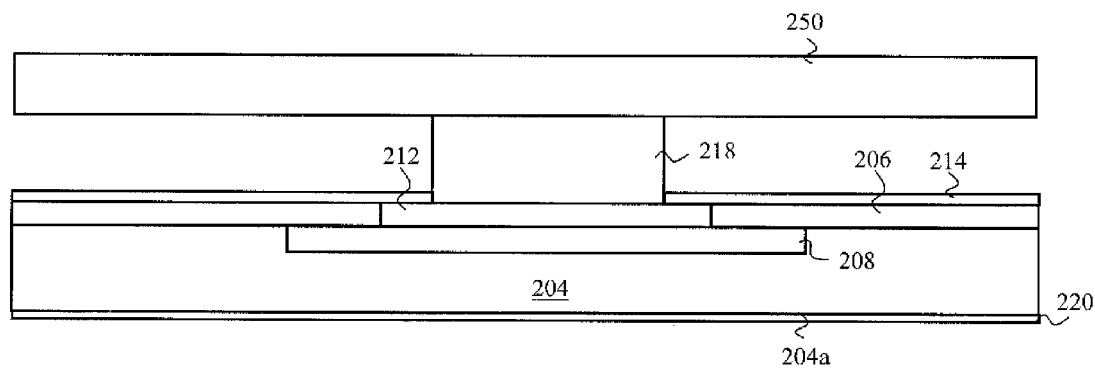

Finally, in FIGS. 2J and 2K, backside processing of the detector array takes place in which the InSb substrate 202 is removed to expose backside surface 204a of the absorber layer 204, and an antireflective coating 220 is formed on the exposed surface of absorber layer 204, respectively. Substrate 202 may be removed by various processes, including but not limited to lapping, diamond point turning, chemical etching, and combinations thereof. Antireflective coating 220 may be comprised of various materials, including but not limited to silicon oxide, silicon dioxide, calcium fluoride, zinc selenide, zinc sulfide, or combinations thereof, and may be formed by various techniques, including but not limited to sputtering, ion beam deposition, or evaporation.

Figure 3A:
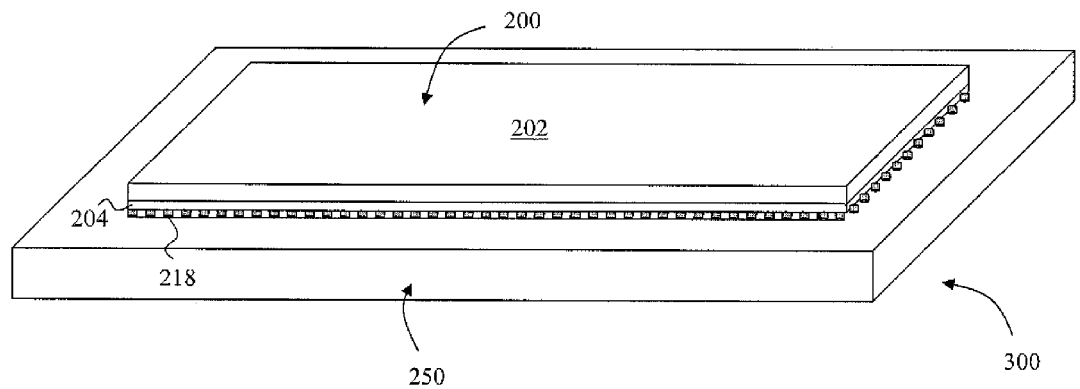
FIGS. 3A-3C show perspective views illustrating fabrication processes of a focal plane array in accordance with an embodiment.
Figure 3B:
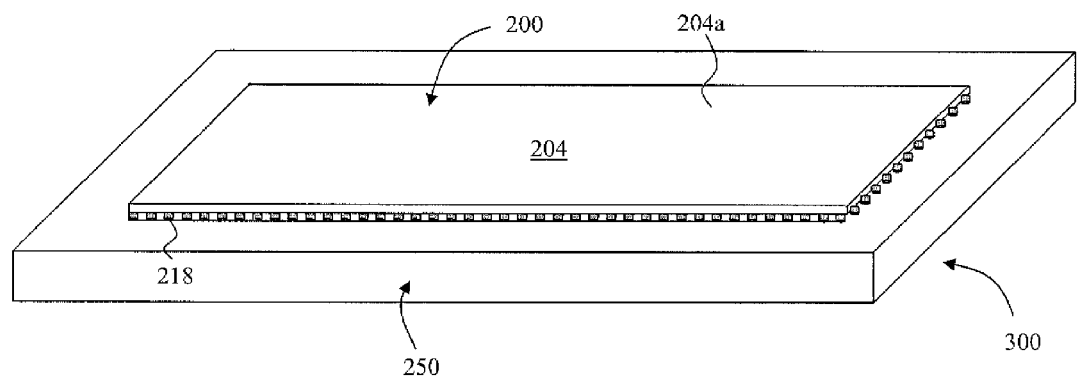
Figure 3C:
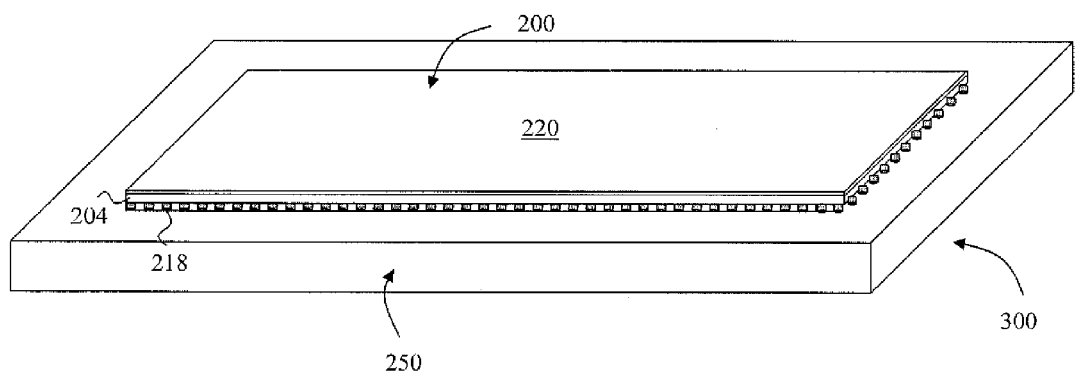

FIGS. 3A-3C show perspective views illustrating backside fabrication processes on a detector array 200 having an array of detectors fabricated as described above with respect to FIGS. 2A-2K in accordance with an embodiment. FIG. 3A illustrates bump contacts 218 of an array of detectors operably coupled to ROIC 250 to form an FPA 300. Detector array 200 includes InSb substrate 202, absorber layer 204, a passivation layer (not shown), a junction (not shown), an overglass layer (not shown), metal contacts (not shown), and other elements as described above with respect to individual detectors in FIGS. 2A-2K. FIG. 3B illustrates the removal of substrate 202 on detector array 200 to expose backside surface 204a of absorber layer 204. FIG. 3C illustrates an antireflective coating 220 formed on the exposed surface of absorber layer 204.

Figure 4:
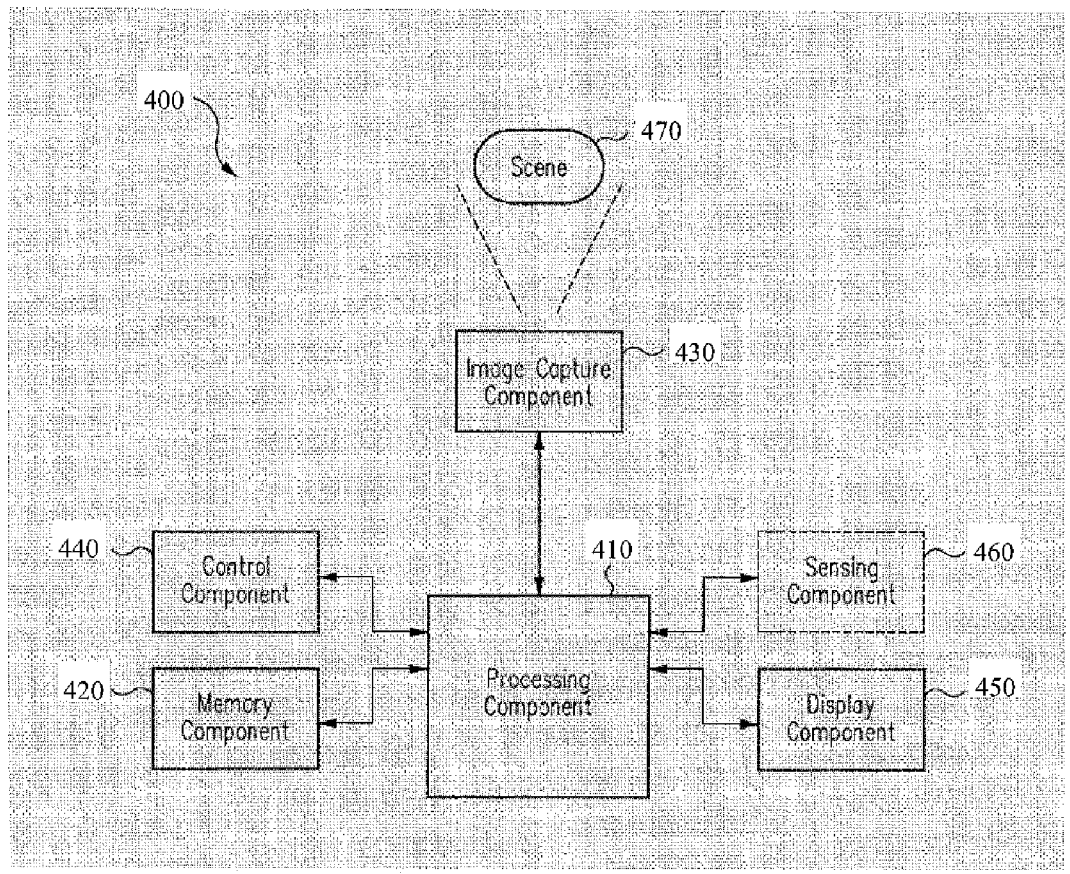
FIG. 4 shows a block diagram illustrating a system for capturing images in accordance with an embodiment.

Referring now to FIG. 4, a block diagram is shown illustrating a system 400 (e.g., an infrared camera) for images and processing in accordance with one or more embodiments. System 400 comprises, in one implementation, a processing component 410, a memory component 420, an image capture component 430, a control component 440, and a display component 450. Optionally, system 400 may include a sensing component 460.

System 400 may represent for example an infrared imaging device, such as an infrared camera, to capture and process images, such as video images of a scene 470. The system 400 may represent any type of infrared camera adapted to detect infrared radiation and provide representative data and information (e.g., infrared image data of a scene) or may represent more generally any type of electro-optical sensor system. System 400 may comprise a portable device and may be incorporated, e.g., into a vehicle (e.g., an automobile or other type of land-based vehicle, an aircraft, a marine craft, or a spacecraft) or a non-mobile installation requiring infrared images to be stored and/or displayed or may comprise a distributed networked system.

In various embodiments, processing component 410 may comprise any type of a processor or a logic device (e.g., a programmable logic device (PLD) configured to perform processing functions). Processing component 410 may be adapted to interface and communicate with components 420, 430, 440, and 450 to perform method and processing steps and/or operations, as described herein such as controlling biasing and other functions (e.g., values for elements such as variable resistors and current sources, switch settings for timing such as for switched capacitor filters, ramp voltage values, etc.) along with conventional system processing functions as would be understood by one skilled in the art.

Memory component 420 comprises, in one embodiment, one or more memory devices adapted to store data and information, including for example infrared data and information. Memory device 420 may comprise one or more various types of memory devices including volatile and non-volatile memory devices. Processing component 410 may be adapted to execute software stored in memory component 420 so as to perform method and process steps and/or operations described herein.

Image capture component 430 comprises, in one embodiment, any type of image sensor, such as for example one or more infrared sensors (e.g., any type of multi-pixel infrared detector, such as a focal plane array with photodiodes as described herein) for capturing infrared image data (e.g., still image data and/or video data) representative of an image, such as scene 470. In one implementation, the infrared sensors of image capture component 430 provide for representing (e.g., converting) the captured image data as digital data (e.g., via an analog-to-digital converter included as part of the infrared sensor or separate from the infrared sensor as part of system 400). In one aspect, the infrared image data (e.g., infrared video data) may comprise non-uniform data (e.g., real image data) of an image, such as scene 470. Processing component 410 may be adapted to process the infrared image data (e.g., to provide processed image data), store the infrared image data in memory component 420, and/or retrieve stored infrared image data from memory component 420. For example, processing component 410 may be adapted to process infrared image data stored in memory component 420 to provide processed image data and information (e.g., captured and/or processed infrared image data).

Control component 440 comprises, in one embodiment, a user input and/or interface device, such as a rotatable knob (e.g., potentiometer), push buttons, slide bar, keyboard, etc., that is adapted to generate a user input control signal. Processing component 410 may be adapted to sense control input signals from a user via control component 440 and respond to any sensed control input signals received therefrom. Processing component 410 may be adapted to interpret such a control input signal as a parameter value, as generally understood by one skilled in the art.

In one embodiment, control component 440 may comprise a control unit (e.g., a wired or wireless handheld control unit) having push buttons adapted to interface with a user and receive user input control values. In one implementation, the push buttons of the control unit may be used to control various functions of the system 400, such as autofocus, menu enable and selection, field of view, brightness, contrast, noise filtering, high pass filtering, low pass filtering, and/or various other features as understood by one skilled in the art.

Display component 450 comprises, in one embodiment, an image display device (e.g., a liquid crystal display (LCD) or various other types of generally known video displays or monitors). Processing component 410 may be adapted to display image data and information on the display component 450. Processing component 410 may be adapted to retrieve image data and information from memory component 420 and display any retrieved image data and information on display component 450. Display component 450 may comprise display electronics, which may be utilized by processing component 410 to display image data and information (e.g., infrared images). Display component 450 may be adapted to receive image data and information directly from image capture component 430 via the processing component 410, or the image data and information may be transferred from memory component 420 via processing component 410.

Optional sensing component 460 comprises, in one embodiment, one or more sensors of various types, depending on the application or implementation requirements, as would be understood by one skilled in the art. The sensors of optional sensing component 460 provide data and/or information to at least processing component 410. In one aspect, processing component 410 may be adapted to communicate with sensing component 460 (e.g., by receiving sensor information from sensing component 460) and with image capture component 430 (e.g., by receiving data and information from image capture component 430 and providing and/or receiving command, control, and/or other information to and/or from one or more other components of system 400).

In various implementations, sensing component 460 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder), and/or whether a tunnel or other type of enclosure has been entered or exited. Sensing component 460 may represent conventional sensors as generally known by one skilled in the art for monitoring various conditions (e.g., environmental conditions) that may have an effect (e.g., on the image appearance) on the data provided by image capture component 430.

In some implementations, optional sensing component 460 (e.g., one or more of sensors) may comprise devices that relay information to processing component 410 via wired and/or wireless communication. For example, optional sensing component 460 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques.

In various embodiments, components of system 400 may be combined and/or implemented or not, as desired or depending on the application or requirements, with system 400 representing various functional blocks of a related system. In one example, processing component 410 may be combined with memory component 420, image capture component 430, display component 450, and/or optional sensing component 460. In another example, processing component 410 may be combined with image capture component 430 with only certain functions of processing component 410 performed by circuitry (e.g., a processor, a microprocessor, a logic device, a microcontroller, etc.) within image capture component 430. Furthermore, various components of system 400 may be remote from each other (e.g., image capture component 430 may comprise a remote sensor with processing component 410, etc. representing a computer that may or may not be in communication with image capture component 430).

Advantageously, embodiments of the invention may provide for enhanced electro-optical performance, for example in the less than 5 μm cutoff waveband regime, improved electro-optical performance at conventional operating temperatures, and/or increased operating temperatures above conventional InSb-based photodiode detectors. Accordingly, one or more embodiments of the invention allow for increased battery life for battery powered image-capture systems and increased cooler life or decreased cooler costs for image-capture systems requiring coolers.

Figure 6:
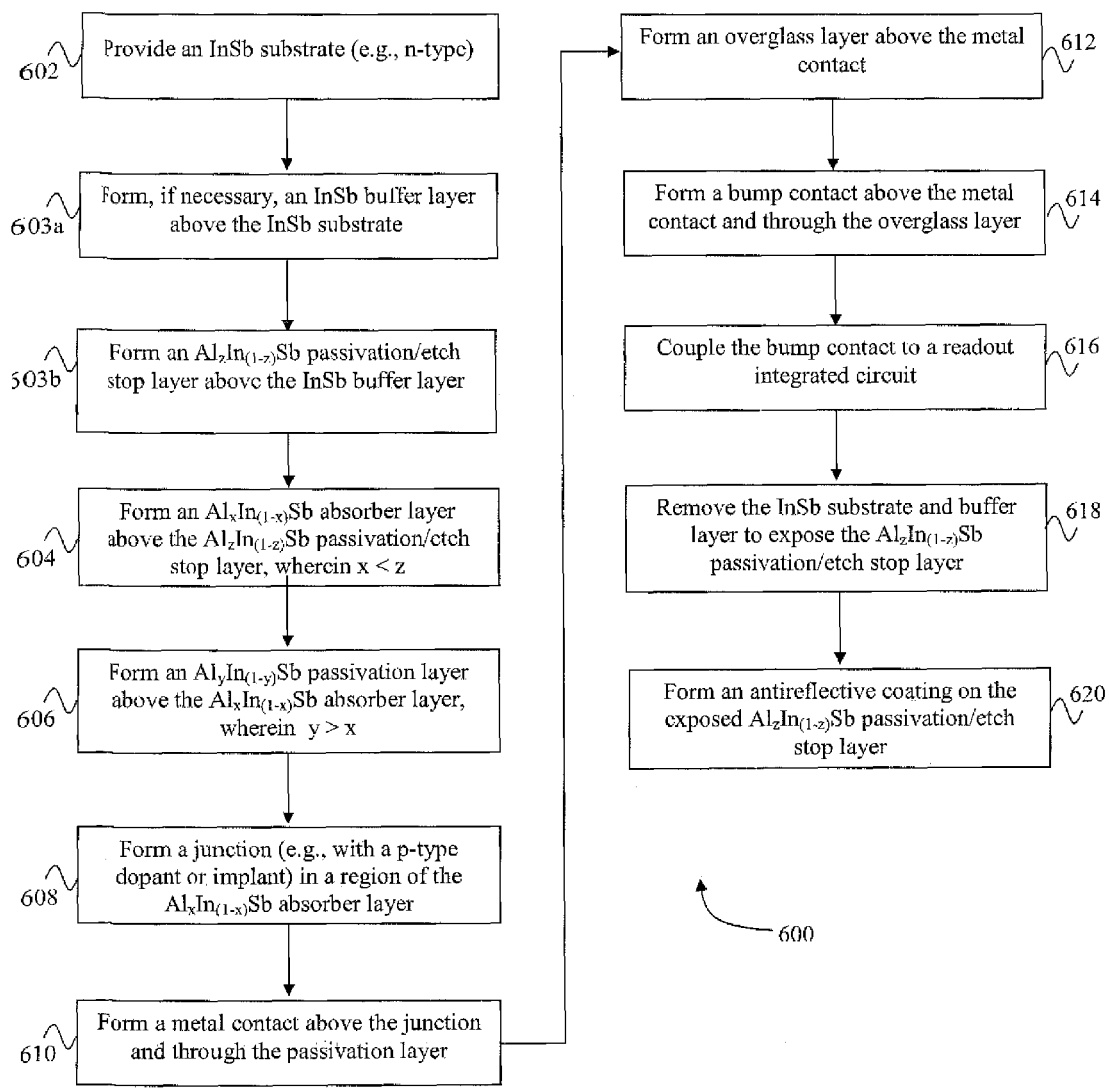
FIG. 6 shows a flow diagram illustrating another method of fabricating a detector in accordance with an embodiment.

Referring now to FIG. 6, a flow diagram is shown illustrating a method 600 of fabricating an improved detector of a detector array in accordance with another embodiment of the present disclosure. Similar to the method 100 of FIG. 1, at block 602, an InSb substrate is provided. Other substrates may be used in other embodiments, such as an AlInSb substrate. However, in this embodiment, an InSb buffer layer is formed above the substrate as necessary, and then an $Al_zIn_{(1-z)}Sb$ passivation/etch stop layer is formed above the substrate (or the InSb buffer layer if formed) as shown at blocks 603a and 603b, respectively. Other passivation/etch stop layers may be used in other embodiments, such as InGaAs, InGaSb, AlGaAs, or a combination of these layers. At block 604, an $Al_xIn_{(1-x)}Sb$ absorber layer is formed above the $Al_zIn_{(1-z)}Sb$ passivation/etch stop layer, with x being less than z. At block 606, an $Al_yIn_{(1-y)}Sb$ passivation layer is formed above the $Al_xIn_{(1-x)}Sb$ absorber layer, with y being greater than x. In one example, the $Al_zIn_{(1-z)}Sb$ passivation/etch stop layer and the $Al_yIn_{(1-y)}Sb$ passivation layer may be comprised of substantially similar material (i.e., z≈y). Thus, passivation layers with a wider bandgap than the absorber layer "sandwich" the absorber layer on both top and bottom surfaces. Advantageously, the InSb buffer layer may trap interface defects beneath the active device, and the wide bandgap passivation/etch stop layer above the InSb buffer layer acts to both passivate the absorber layer and to stop a chemical etch of the InSb substrate. Thus, the passivation/etch stop layer of the present disclosure acts to passivate the backside surface of the absorber layer to improve the operating performance of the device and also acts as a chemical etch stop layer to allow for a precise and reproducible final thickness of the absorber layer to optimize IR absorption and minimize thickness for lower growth costs and improved thickness control/FPA yield.

At block 608, a junction is formed in a region of the $Al_xIn_{(1-x)}Sb$ absorber layer through the $Al_yIn_{(1-y)}Sb$ passivation layer. In one example, a p-type dopant or implant may be used in an n-type doped absorber layer to form a p-n junction. In other examples and embodiments, an n-type dopant or implant may be used in a p-type doped absorber layer to form an n-p junction. At block 610, a metal contact is formed above the junction and through the passivation layer.

At block 612, an overglass layer is formed above the metal contact, and at block 614, a bump contact (e.g., comprised of indium) is formed above the metal contact and through the overglass layer. In other examples and embodiments, the fabrication order of blocks 610 and 612 may be switched such that 1) an overglass layer is formed above the passivation layer and junction, 2) then a metal contact is formed directly above the junction through the overglass and passivation layers, and 3) a bump contact is formed above the metal contact (without going through an overglass layer).

Next, at block 616, the bump contact is coupled to a readout integrated circuit (ROIC). Finally, backside processing takes place in which the InSb substrate and any formed InSb buffer layer are mechanically or chemically removed. In one embodiment, the InSb substrate is first removed to within 1-30 microns by mechanical or chemical etch. The remaining InSb substrate is then chemically removed to expose the $Al_zIn_{(1-z)}Sb$ passivation/etch stop layer at block 618, and an antireflective coating is formed on the exposed passivation/etch stop layer at block 620. Therefore, for an embodiment, an array of detectors may be provided to form at least in part a sensor array.

Figure 7A:
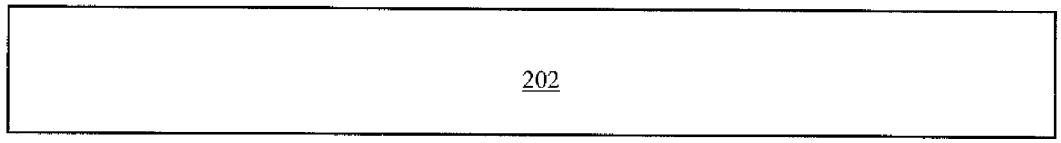
FIGS. 7A-7K show cross-sectional diagrams illustrating fabrication processes of a detector in accordance with an embodiment of the method shown in FIG. 6.

Referring now to FIGS. 7A-7K, cross-sectional diagrams illustrate fabrication processes of a detector in accordance with an embodiment of the method 600. FIG. 7A illustrates an InSb substrate 202. The InSb substrate 202 may be, in one example, doped with an n-type dopant. Surfaces of substrate 202 are cleaned to provide surfaces substantially free of unwanted contaminants. Examples of cleaning techniques include but are not limited to oxygen removal by thermal desorption or hydrogen cleaning.

Figure 7B:
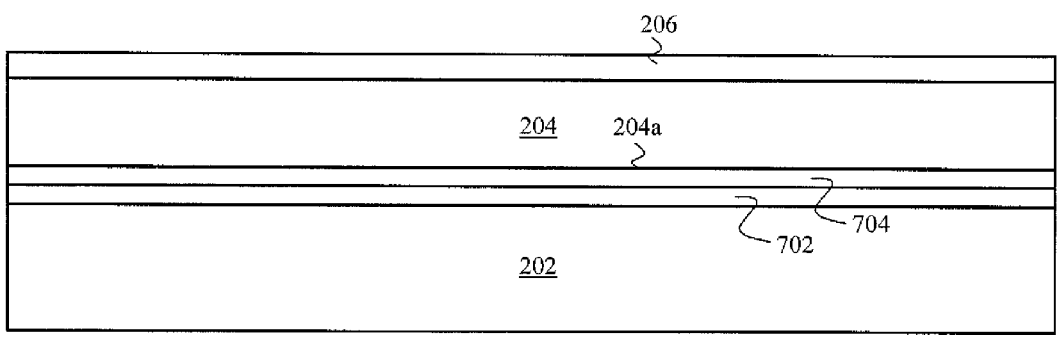

FIG. 7B illustrates an InSb buffer layer 702 formed above the substrate 202 as necessary, and then an $Al_zIn_{(1-z)}Sb$ passivation/etch stop layer 704 formed above the buffer layer 702. Other passivation/etch stop layers that may be used include but are not limited to InGaAs, InGaSb, AlGaAs, or a combination of these layers. An $Al_xIn_{(1-x)}Sb$ absorber layer 204 is formed above a first surface of the passivation/etch stop layer 704, with x being less than z, and an $Al_yIn_{(1-y)}Sb$ passivation layer 206 is formed above the $Al_xIn_{(1-x)}Sb$ absorber layer 204, with y being greater than x. In one example, the $Al_zIn_{(1-z)}Sb$ passivation/etch stop layer 704 and the $Al_yIn_{(1-y)}Sb$ passivation layer 206 may be comprised of substantially similar material (i.e., z≈y). Thus, passivation layers 704 and 206 with a wider bandgap than the absorber layer 204 "sandwich" the absorber layer on both top and bottom surfaces.

In one example, z is between about 0.02 and about 0.13, x is between about 0.01 and about 0.1, and y is between about 0.02 and about 0.13, with z>x and y>x. In another example, z is between about 0.03 and about 0.05, x is between about 0.01 and about 0.03, and y is between about 0.03 and about 0.05, with z>x and y>x. In one example, the $Al_zIn_{(1-z)}Sb$ passivation/etch stop layer 704 has a thickness between about 100 angstroms and about 10,000 angstroms, the $Al_xIn_{(1-x)}Sb$ absorber layer 204 has a thickness between about 30,000 angstroms and about 150,000 angstroms, and the $Al_yIn_{(1-y)}Sb$ passivation layer 206 has a thickness between about 100 angstroms and about 10,000 angstroms.

In yet another example, the $Al_zIn_{(1-z)}Sb$ passivation layer 704 has a thickness of about 2,000 angstroms, the $Al_xIn_{(1-x)}Sb$ absorber layer 204 has a thickness of about 150,000 angstroms, and the $Al_yIn_{(1-y)}Sb$ passivation layer 206 has a thickness of about 2,000 angstroms. In yet another example, the $Al_xIn_{(1-x)}Sb$ absorber layer 204 may be doped with an n-type dopant at a doping concentration of about $10^{15}$ cm$^{-3}$, and the $Al_yIn_{(1-y)}Sb$ passivation layer 206 may be doped with an n-type dopant at a doping concentration of about $10^{18}$ cm$^{-3}$.

The InSb buffer layer 702, the $Al_zIn_{(1-x)}Sb$ passivation layer 704, the $Al_xIn_{(1-x)}Sb$ absorber layer 204, and the $Al_yIn_{(1-y)}Sb$ passivation layer 206 are each epitaxial layers in one embodiment. In yet another aspect of the present disclosure, the passivation/etch stop layer 704, the absorber layer 204, and the passivation layer 206 are epitaxial layers formed consecutively during one growth run, and the layers may be formed by various techniques for forming epitaxial layers, such as but not limited to, molecular beam epitaxy (MBE), metal-organic condensed vapor deposition (MOCVD), or liquid phase epitaxy (LPE). Advantageously, by forming the passivation/etch stop layer, the absorber layer, and the passivation layer consecutively during one growth run, defects at the interface of the passivation/etch stop layer, the absorber layer, and the passivation layer are substantially eliminated, thereby improving electro-optical and temperature performance of the detector to be fabricated as well as the overall pixel operability of the device.

Furthermore, by forming the layers 704, 204, and 206 consecutively during a single growth run, the incorporation of contaminants at the interfaces of (1) the absorber layer and the passivation layer and (2) the absorber layer and the passivation/etch stop layer, which can decrease device performance, is minimized or substantially avoided and ultimately removes these interfaces from the critical layer interfaces.

Also, the AlInSb materials used in the absorber layer of one embodiment allow for shortening the material cutoff when compared to InSb, which has a longer electro-optical cutoff than necessary to fully absorb the desired wavebands, thus allowing for lower dark current and improved electro-optical performance at elevated operating temperatures.

It is noted that although in this embodiment, the $Al_zIn_{(1-z)}Sb$ passivation/etch stop layer is formed above an appropriate buffer layer, the $Al_zIn_{(1-z)}Sb$ passivation/etch stop layer may be formed above a near-lattice matched InSb substrate without using a buffer layer therebetween.

Figure 7C:
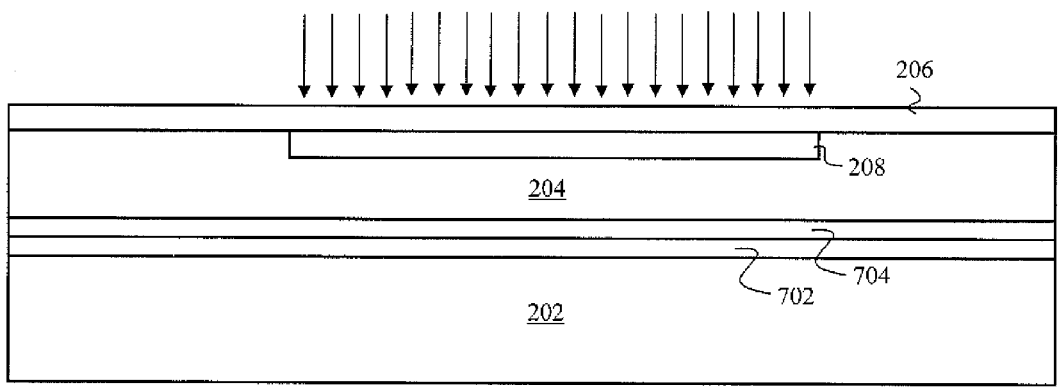

FIG. 7C illustrates a doped region 208 formed in the $Al_xIn_{(1-x)}Sb$ absorber layer 204 through the $Al_yIn_{(1-y)}Sb$ passivation layer 206 to form a junction in a region of the absorber layer, thereby forming a detector region in the absorber layer. In one example, a p-type dopant or implant may be used in an n-type doped absorber layer to form a p-n junction. Formation of the detector array includes, in one example, providing a photoresist (not shown) with a junction formation pattern over the wafer of FIG. 7B, and then exposing and developing the pattern in accordance with conventional photolithographic techniques.

The wafer is then ion implanted through the photoresist pattern to form an array of individual junctions or pixels in the absorber layer 204. The wafer is then annealed to activate the implants and to substantially remove implant damage (i.e., fix semiconductor material potentially damaged during the implant process). It is noted that either p-type implantation or thermal diffusion of a p-type doping material may be used to form the doped regions. Examples of p-type implant materials include but are not limited to Be, Se, and S, and examples of p-type doping materials include but are not limited to Cd, Hg, and Zn. In other examples and embodiments, an n-type dopant or implant may be used in a p-type doped absorber layer to form a n-p junction.

Although not explicitly shown in this embodiment, growth of an intrinsic layer (e.g., lightly doped or undoped) between the absorber layer 204 and the passivation layer 206 to subsequently form p-i-n or n-i-p junctions is within the scope of this embodiment, and descriptions related to the intrinsic layer illustrated in FIGS. 5A-5C and further described above are fully applicable here.

Figure 7D:
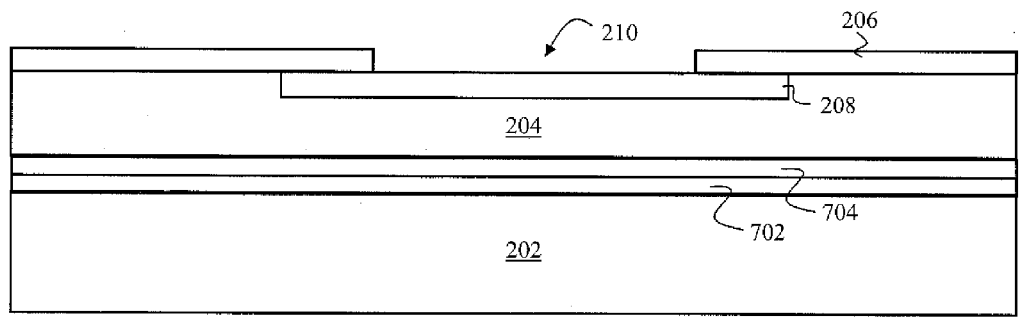

Referring now to FIG. 7D, an etch of the passivation layer 206 is illustrated to farm an opening 210 in passivation layer 206 above the doped region 208 and the junction. A photoresist pattern (not shown) may be used in accordance with conventional photolithography and etching techniques to perform the etch of the passivation layer over each doped region 208 and junction.

Figure 7E:
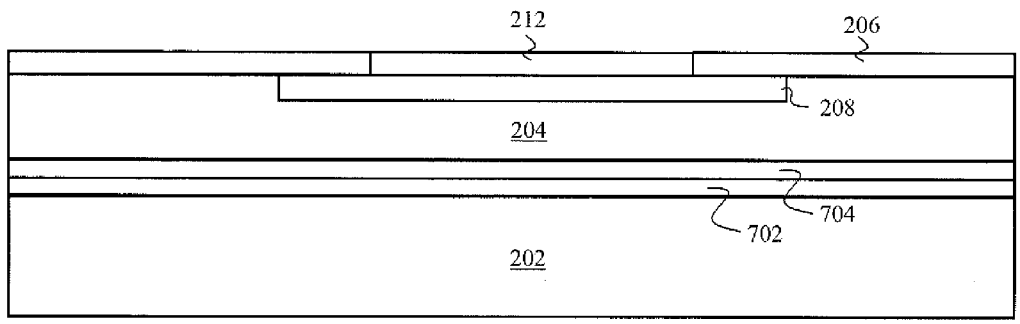

FIG. 7E illustrates a metal contact 212 formed above the junction 208 and through the passivation layer 206 within opening 210. Metal contact 212 may be comprised of various metals, including but not limited to nickel, chrome, titanium, tungsten, indium, or alloys thereof, and may be deposited by various techniques, including but not limited to evaporation or sputtering. A liftoff process then removes excess metal. In another example, sheet deposition of metal film, photolithography, and etch may be used to form the metal contact, such as in plating applications.

Figure 7F:
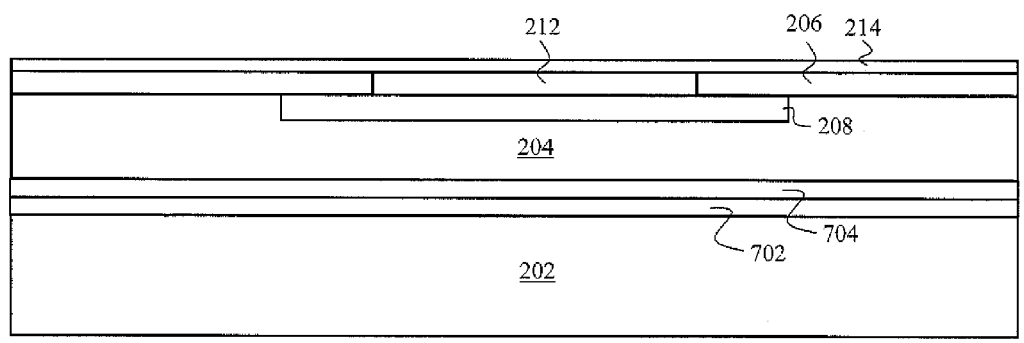

FIG. 7F illustrates an overglass layer 214 formed above the metal contact 212 and passivation layer 206. Overglass layer 214 may be comprised of various materials, including but not limited to silicon nitride, silicon oxide, silicon oxynitride, or combinations thereof, and may be deposited by various techniques, including but not limited to chemical vapor deposition (CVD) or plasma-enhanced CVD.

Figure 7G:
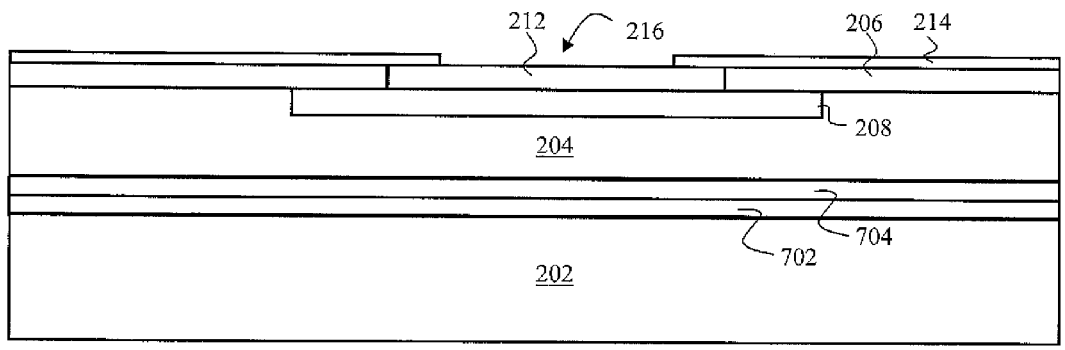

FIG. 7G illustrates a selective etch of the overglass layer 214 to form an opening 216 in overglass layer 214 above the metal contact 212. A photoresist pattern (not shown) may be used in accordance with conventional photolithography and etch techniques to perform the etch of the overglass layer over each doped region 208 and junction.

Figure 7H:
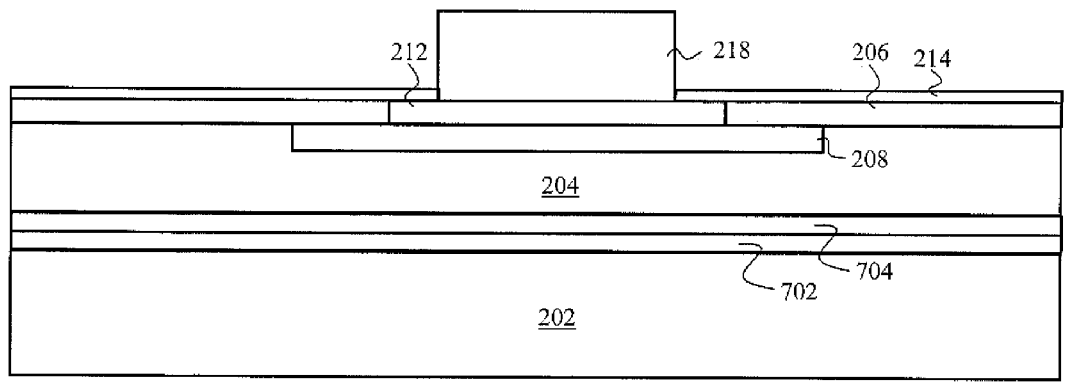

FIG. 7H illustrates a bump contact 218 formed above the metal contact 212 and through the overglass layer 214 within opening 216. Bump contact 218 may be comprised of various materials, including but not limited to indium, and may be deposited by various techniques, including but not limited to evaporation or plating. A liftoff process then removes excess indium.

In other examples and embodiments, the fabrication order may be switched such that 1) an overglass layer is formed above the passivation layer and junction, 2) then a metal contact is formed directly above the junction through the overglass and passivation layers, and 3) a bump contact is formed above the metal contact (without going through an overglass layer).

Figure 7I:
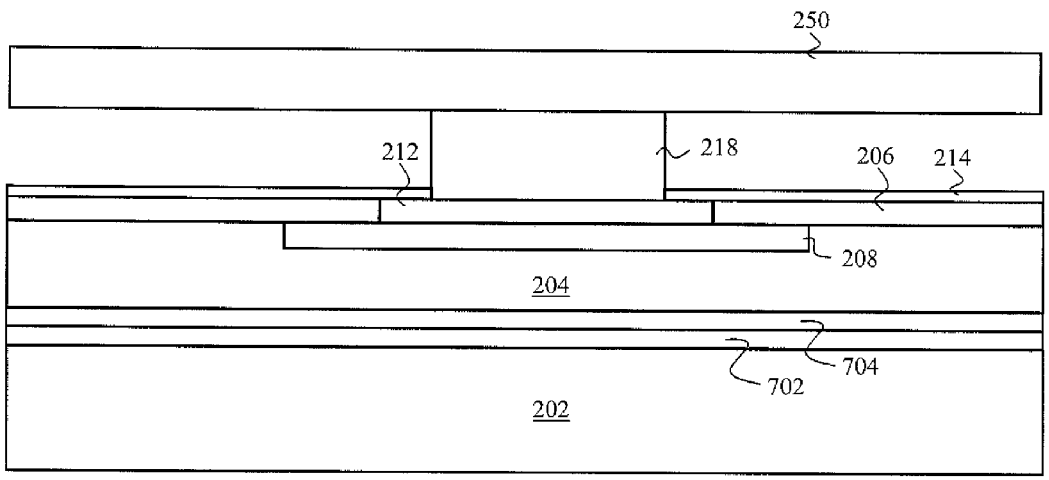

Next, in FIG. 7I, the bump contact 218 is operably coupled to a readout integrated circuit (ROIC) 250 to form a focal plane array structure. Fabrication of the detector array includes, in one example, aligning an array of indium bumps on the detector array to corresponding indium bumps (not shown) on the ROTC 250 and operably coupling the corresponding indium bumps together.

Figure 7J:
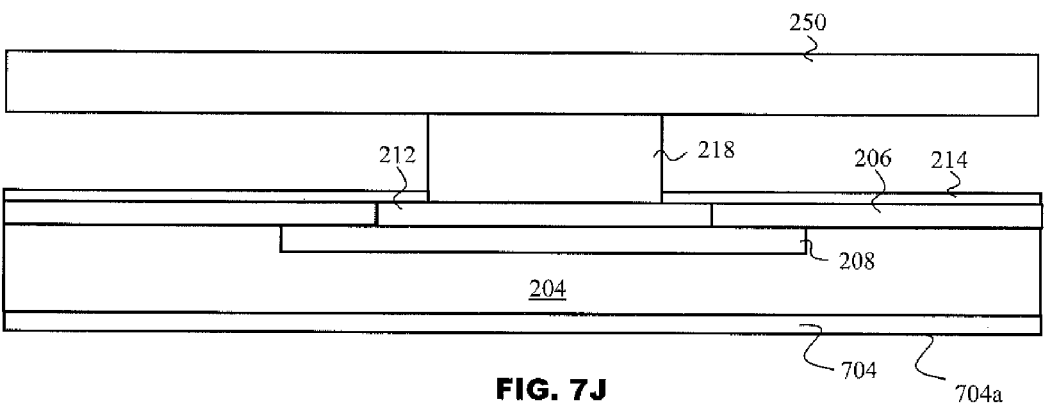
Figure 7K:
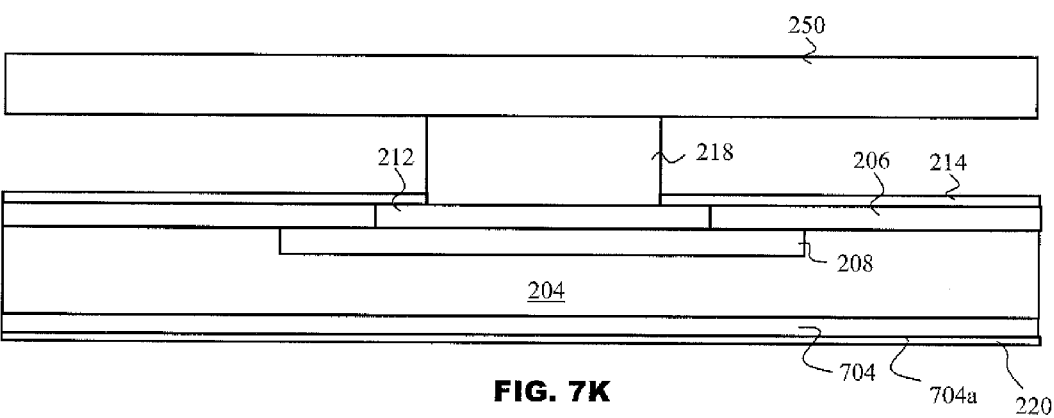

In FIGS. 7J-7K, backside processing of the detector array takes place. In FIG. 7J, the InSb substrate 202 and the buffer layer 702 are removed by a mechanical process or a combination of a mechanical and chemical process, such as lapping, diamond point turning, or combinations thereof, with passivation/etch stop layer 704 being used as an etch stop for a final chemical etch process. In FIG. 7K, an antireflective coating 220 is formed on an exposed backside surface 704a of passivation/etch stop layer 704. Antireflective coating 220 may be comprised of various materials, including but not limited to silicon oxide, silicon dioxide, calcium fluoride, zinc selenide, zinc sulfide, or combinations thereof, and may be formed by various techniques, including but not limited to sputtering, ion beam deposition, or evaporation.

It is noted that the focal plane array with photodiodes as described above with respect to FIGS. 6-7L may be a part of image capture component 430 of system 400 as described above for capturing infrared image data representative of an image.

Advantageously, the present disclosure provides for improved backside passivation of the absorber layer and simpler backside processing with a simpler backside etch of the substrate.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected is:

1. A detector comprising:
   an $Al_zIn_{(1-z)}Sb$ passivation/etch stop layer;
   an $Al_xIn_{(1-x)}Sb$ absorber layer disposed above the $Al_zIn_{(1-z)}Sb$ passivation/etch stop layer, wherein x<z;
   an $Al_yIn_{(1-y)}Sb$ passivation layer disposed above the $Al_xIn_{(1-x)}Sb$ absorber layer, wherein x<y;
   a junction formed in a region of the $Al_xIn_{(1-x)}Sb$ absorber layer; and
   a metal contact disposed above the junction and through the $Al_yIn_{(1-y)}Sb$ passivation layer.

2. The detector of claim 1, wherein the $Al_zIn_{(1-z)}Sb$ passivation/etch stop layer, the $Al_xIn_{(1-x)}Sb$ absorber layer, and the $Al_yIn_{(1-y)}Sb$ passivation layer are each epitaxial layers formed consecutively during one growth run.

3. The detector of claim 1, wherein z is between about 0.02 and about 0.13, x is between about 0.01 and about 0.1, and y is between about 0.02 and about 0.13.

4. The detector of claim 1, wherein the $Al_zIn_{(1-z)}Sb$ passivation/etch stop layer has a thickness between about 100 angstroms and about 10,000 angstroms, the $Al_xIn_{(1-x)}Sb$ absorber layer has a thickness between about 30,000 angstroms and about 150,000 angstroms, and the $Al_yIn_{(1-y)}Sb$ passivation layer has a thickness between about 100 angstroms and about 10,000 angstroms.

5. The detector of claim 1, wherein the junction is selected from the group consisting of a p-n junction, an n-p junction, a p-i-n junction, and a n-i-p junction.

6. The detector of claim 1, comprising:
   an overglass layer disposed above the $Al_yIn_{(1-y)}Sb$ passivation layer; and
   an indium bump disposed above the metal contact and the overglass layer.

7. The detector of claim 1, comprising:
   an antireflective layer disposed below the $Al_xIn_{(1-x)}Sb$ absorber layer.

8. The detector of claim 1, comprising:
   an InSb substrate above which an InSb buffer layer, the $Al_zIn_{(1-z)}Sb$ passivation/etch stop layer, and the $Al_xIn_{(1-x)}Sb$ absorber layer are formed, wherein the InSb substrate and the InSb buffer layer are subsequently removed to expose a back surface of the $Al_zIn_{(1-z)}Sb$ passivation/etch stop layer.

9. An infrared sensor array comprising:
   a two-dimensional array of detectors, each of the detectors comprising:
   an $Al_zIn_{(1-z)}Sb$ passivation/etch stop layer
   an $Al_xIn_{(1-x)}Sb$ absorber layer disposed above the $Al_zIn_{(1-z)}Sb$ passivation/etch stop layer, wherein x<z;
   an $Al_yIn_{(1-y)}Sb$ passivation layer disposed above the $Al_xIn_{(1-x)}Sb$ absorber layer, wherein x<y;
   a junction formed in a region of the $Al_xIn_{(1-x)}Sb$ absorber layer;
   a metal contact disposed above the junction and through the $Al_yIn_{(1-y)}Sb$ passivation layer;
   an overglass layer disposed above the metal contact; and
   a bump contact disposed above the metal contact and through the overglass layer.

10. The sensor array of claim 9, wherein the $Al_zIn_{(1-z)}Sb$ passivation/etch stop layer, the $Al_xIn_{(1-x)}Sb$ absorber layer, and the $Al_yIn_{(1-y)}Sb$ passivation layer are each epitaxial layers formed consecutively during one growth run.

11. The sensor array of claim 9, wherein z is between about 0.02 and about 0.13, x is between about 0.01 and about 0.1, and y is between about 0.02 and about 0.13.

12. The sensor array of claim 9, comprising:
    an antireflective layer disposed below the $Al_xIn_{(1-x)}Sb$ absorber layer.

13. The sensor array of claim 9, comprising:
    an InSb substrate above which an InSb buffer layer, the $Al_zIn_{(1-z)}Sb$ passivation/etch stop layer, and the $Al_xIn_{(1-x)}Sb$ absorber layer are formed, wherein the InSb substrate and the InSb buffer layer are subsequently removed to expose a back surface, of the $Al_zIn_{(1-z)}Sb$ passivation/etch stop layer.

14. A method of fabricating a detector, the method comprising:
    providing an InSb substrate;
    forming, by epitaxial growth in one growth run, an $Al_zIn_{(1-z)}Sb$ passivation/etch stop layer above a surface of the InSb substrate, an $Al_xIn_{(1-x)}Sb$ absorber layer above a surface of the $Al_zIn_{(1-z)}Sb$ passivation/etch stop layer, and an $Al_yIn_{(1-y)}Sb$ passivation layer above the $Al_xIn_{(1-x)}Sb$ absorber layer, wherein x<z and x<y;
    forming a junction in a region of the $Al_xIn_{(1-x)}Sb$ absorber layer;
    forming a metal contact above the junction and through the $Al_yIn_{(1-y)}Sb$ passivation layer; and
    removing the InSb substrate to expose the $Al_zIn_{(1-z)}Sb$ passivation/etch stop layer.

15. The method of claim 14, wherein the $Al_zIn_{(1-z)}Sb$ passivation/etch stop layer, the $Al_xIn_{(1-x)}Sb$ absorber layer, and the $Al_yIn_{(1-y)}Sb$ passivation layer are each formed by one of molecular beam epitaxy (MBE), metal-organic condensed vapor deposition (MOCVD), or liquid phase epitaxy (LPE).

16. The method of claim 14, wherein z is between about 0.02 and about 0.13, x is between about 0.01 and about 0.1, and y is between about 0.02 and about 0.13.

17. The method of claim 14, wherein the $Al_zIn_{(1-z)}Sb$ passivation/etch stop layer is formed to a thickness between about 100 angstroms and about 10,000 angstroms, the $Al_xIn_{(1-x)}Sb$ absorber layer is formed to a thickness between about 30,000 angstroms and about 150,000 angstroms, and the $Al_yIn_{(1-y)}Sb$ passivation layer is formed to a thickness between about 100 angstroms and about 10,000 angstroms.

18. The method of claim 14, wherein the InSb substrate is removed by mechanical and/or chemical etching.

19. The method of claim 14, wherein forming the junction includes forming one of a p-n junction, an n-p junction, a p-i-n junction, or a n-i-p junction.

20. The method of claim 14, comprising:
    forming an antireflective layer over the exposed $Al_zIn_{(1-z)}Sb$ passivation/etch stop layer.

* * * * *